US009923592B2

(12) United States Patent
Choi

(10) Patent No.: US 9,923,592 B2
(45) Date of Patent: Mar. 20, 2018

(54) ECHO CANCELLATION USING MINIMAL COMPLEXITY IN A DEVICE

(71) Applicant: Intel Corporation, Santa Clara, CA (US)

(72) Inventor: Yang-Seok Choi, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 14/757,836

(22) Filed: Dec. 26, 2015

(65) Prior Publication Data

US 2017/0187415 A1    Jun. 29, 2017

(51) Int. Cl.
| | |
|---|---|
| *H04B 1/44* | (2006.01) |
| *H04B 1/04* | (2006.01) |
| *H04B 1/10* | (2006.01) |
| *H04B 1/525* | (2015.01) |
| *H04B 3/23* | (2006.01) |
| *H04B 5/00* | (2006.01) |

(52) U.S. Cl.
CPC ............ *H04B 1/44* (2013.01); *H04B 1/0475* (2013.01); *H04B 1/10* (2013.01); *H04B 1/525* (2013.01); *H04B 3/23* (2013.01); *H04B 5/005* (2013.01); *H04B 2001/045* (2013.01)

(58) Field of Classification Search
CPC ... H04B 1/44; H04B 1/0475; H04B 2001/045
See application file for complete search history.

(56) References Cited

U.S. PATENT DOCUMENTS

| 5,636,272 A | 6/1997 | Rasmusson |
| 6,278,785 B1 | 8/2001 | Thomasson et al. |
| 6,963,643 B1 | 11/2005 | Lilliott et al. |
| (Continued) | | |

FOREIGN PATENT DOCUMENTS

| CN | 1856944 A | 11/2006 |
| CN | 101083495 A | 12/2007 |
| (Continued) | | |

OTHER PUBLICATIONS

Extended European Search Report received for European Patent Application No. 11878164.0, dated Jul. 17, 2015, 6 pages.
(Continued)

*Primary Examiner* — Yuwen Pan
*Assistant Examiner* — Fatuma Sherif
(74) *Attorney, Agent, or Firm* — Schiff Hardin LLP

(57) ABSTRACT

Described herein are technologies related to an implementation of a system to measure and compensate non-linearity (e.g., echo cancellation) in a transceiver circuitry of a device. Particularly, the echo cancellation utilizes reduced number of components for power savings, and further increases efficiency of signal or data packet transmissions in the device. An echo signal is determined by sampling a power amplifier output signal. The output signal is split into signals with different delays. Down conversion and digital interpolation of the signal with the shortest delay is performed. An echo cancellation signal is calculated based on the output signal as received as an input signal to a receive chain. The calculated signal is subtracted from a received echo signal to generate an echo free signal.

20 Claims, 7 Drawing Sheets

(56) References Cited

U.S. PATENT DOCUMENTS

| | | | |
|---|---|---|---|
| 7,916,671 | B1 | 3/2011 | McAdam et al. |
| 8,019,028 | B1 | 9/2011 | Zortea et al. |
| 8,055,235 | B1 | 11/2011 | Gupta et al. |
| 9,282,564 | B2 | 3/2016 | Choi |
| 2004/0114542 | A1 | 6/2004 | Stonier et al. |
| 2004/0144542 | A1 | 7/2004 | Chiappa et al. |
| 2005/0099967 | A1 | 5/2005 | Baba et al. |
| 2005/0163249 | A1 | 7/2005 | McCallister et al. |
| 2006/0267734 | A1 | 11/2006 | Taki et al. |
| 2007/0194886 | A1 | 8/2007 | Bang et al. |
| 2008/0232268 | A1 | 9/2008 | Kahrizi et al. |
| 2009/0130981 | A1 | 5/2009 | Nagai et al. |
| 2010/0226492 | A1 | 9/2010 | Takada et al. |
| 2010/0253420 | A1* | 10/2010 | Xiao ............... H04L 25/0272 327/540 |
| 2011/0019831 | A1 | 1/2011 | Liu |
| 2011/0134810 | A1 | 6/2011 | Yamamoto et al. |
| 2012/0252382 | A1 | 10/2012 | Bashir et al. |
| 2012/0269102 | A1 | 10/2012 | Nicholls et al. |
| 2013/0040555 | A1 | 2/2013 | Rimini et al. |
| 2013/0102254 | A1* | 4/2013 | Cyzs ................. H04B 1/126 455/63.1 |
| 2014/0376416 | A1* | 12/2014 | Choi ................. H04B 3/23 370/277 |
| 2016/0285486 | A1 | 9/2016 | Qin et al. |

FOREIGN PATENT DOCUMENTS

| | | | |
|---|---|---|---|
| CN | 101785212 | A | 7/2010 |
| CN | 102025395 | A | 4/2011 |
| CN | 102111358 | A | 6/2011 |
| CN | 102165709 | A | 8/2011 |
| CN | 102282782 | A | 12/2011 |
| CN | 104852752 | A | 8/2015 |
| JP | 2005-253058 | A | 9/2005 |
| JP | 2007-281592 | A | 10/2007 |
| JP | 2010-022009 | A | 1/2010 |
| JP | 2011-120120 | A | 6/2011 |
| KR | 10-2011-0025667 | A | 3/2011 |
| WO | 2010/077545 | A1 | 7/2010 |
| WO | 2013/095386 | A1 | 6/2013 |

OTHER PUBLICATIONS

Office Action received for Chinese Patent Application No. 201180075745.9, dated Jan. 4, 2015, 15 pages of English Translation and 10 pages of Chinese Office Action.

Office Action received for Japanese Patent Application No. 2014-548752, dated Apr. 21, 2015, 4 pages of Japanese Office Action and 5 pages English Translation.

International Preliminary Report on Patentability and Written Opinion Received for PCT Patent Application No. PCT/US2011/066181, dated Jul. 3, 2014, 6 pages.

International Search Report and Written Opinion received for PCT Patent Application No. PCT/US2011/066181, dated May 22, 2012, 9 pages.

International Preliminary Report on Patentability and Written Opinion Received for PCT Patent Application No. PCT/US2013/060445, dated Jun. 18, 2015, 6 pages.

International Search Report and Written Opinion received for PCT Patent Application No. PCT/US2013/060445, dated Feb. 7, 2014, 9 pages.

Final Office Action received for U.S. Appl. No. 13/976,423, dated May 27, 2016, 27 pages.

Non-Final Office Action received for U.S. Appl. No. 13/976,423, dated Dec. 17, 2015, 27 pages.

Notice of Allowance received for U.S. Appl. No. 13/976,423, dated Aug. 25, 2016, 16 pages.

Non-Final Office Action received for U.S. Appl. No. 14/128,278, dated Jul. 14, 2015, 9 pages.

Notice of Allowance received for U.S. Appl. No. 14/128,278, dated Nov. 10, 2015, 8 pages.

Extended European Search report received for European Patent Application No. 16198999.1, dated Jan. 26, 2017, 9 pages.

Office Action received for Chinese Patent Application No. 201180075745.9, dated Jan. 26, 2017, 9 pages of Chinese Office Action including 5 pages of English translation.

Office Action received for Chinese Patent Application No. 201180075745.9, dated Mar. 15, 2016, 12 pages of Chinese Office Action including 7 pages of English translation.

* cited by examiner

ECHO CANCELLATION USING MINIMAL COMPLEXITY IN A DEVICE

BACKGROUND

In an Asymmetrical Digital Subscriber Line (ADSL) modem and Speaker phone, echo cancellation (EC) technology has been widely used to improve quality of service (QoS) for end-users. For example, a typical line echo canceller (LEC) is generally used to remove electrical echoes due to reflections of hybrid components on a network where 2-line and/or 4-line conversions take place. Another type of echo canceller is an acoustic echo canceller (AEC) that may be used to remove acoustic echoes due to acoustic sound feedback from a speaker to a microphone on a hand-free speaker phone, mobile phone, or conference phone.

In the above examples of echo cancellers, and in types of present echo canceller technologies, substantially large processing power and high memory storage are required. For example, for RF echo cancellation technology in analogue domain that employs different kinds of filters, such as a finite impulse response (FIR), the use of large number of components such as down-converters that come with the use of the FIR filter consumes a substantial amount of device power.

As such, the designing of a system to implement the echo cancellation may require robust and careful adjustments to improve power savings and data transmission efficiency.

DETAILED DESCRIPTION

Figure 1:
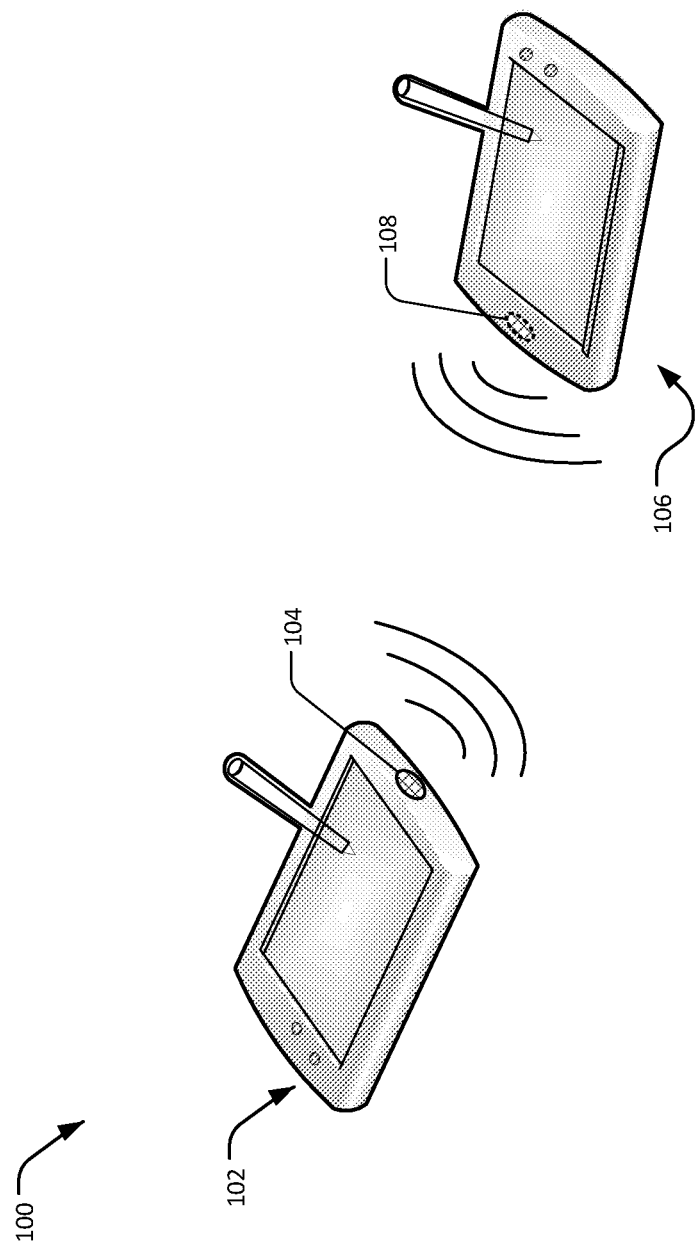
FIG. 1 illustrates an example scenario that utilizes a system for self-interference cancellation in a transceiver circuitry of a portable device.

Described herein is a technology for implementing self-interference cancellation (e.g., echo cancellation) in a transceiver circuitry of a device (e.g., wireless device). Particularly, the echo cancellation utilizes reduced number of components for power savings, complexity reduction and further increases efficiency of signal or data packet transmissions in the device by in-band full duplex operation i.e., simultaneous transmission and reception in same time and frequency.

For example, prior to transmission of an original signal, the transceiver circuitry may be configured to initially perform echo cancellation in order to minimize and/or cancel (original) signal leakages from a transceiver transmit chain to a transceiver receive chain in the wireless device. In this example, the echo cancellation may include determination of an estimated echo signal $\hat{y}(t)$ that is subtracted from an actual echo signal y (t) to generate an echo-free signal z (t).

As described in present implementations herein, the estimated echo signal $\hat{y}(t)$ may be derived from a combination of analog sampling of a power amplifier (PA) output signal (of the transmit chain), and performing of a digital interpolation and digital adaptive algorithm to generate, for example, a digital weight w. The digital weight w is multiplied by a signal with a particular delay ($\tau$) from the sampled PA output signal in order to generate a particular estimated echo signal $\hat{y}(t)$. Multiple particular estimated echo signals $\hat{y}(t)$ are combined to derive the total amount of the estimated echo signal $\hat{y}(t)$ that is subtracted from the actual echo signal y (t).

In generating the total estimated echo signal $\hat{y}(t)$, a single down-converter component may be coupled to a finite impulse response (FIR) filter, which provides the different delays ($\tau$) based from a bandwidth of the sampled PA output signal and delay spread of echoes. An output of the single down-converter is further interpolated digitally, and processed through a processor (i.e., adaptive algorithm) to generate the digital weight w. The digital weight w, for example, facilitates adjustment of amplitude and phase of the particular tap-delay signal $x(t-\tau'_k)$. In this example, the particular vector modulator performs complex multiplication between each delay of the different delays ($\tau$) and a corresponding digital weight (w) signal to generate the echo cancelling signal (i.e., estimated echo signal $\hat{y}(t)$).

The use of the single down-converter component, in addition to a second down-converter component that is disposed at the transceiver receive chain, reduces substantially the number of down-converter components that are needed to implement echo cancellation. Thus, power savings may be derived from the reduced number of down-converter components and ADC (analog-digital converter) and furthermore, noise reduction and DC offset correction in weight calculation is made possible due to the combined use of the analog and digital domain on the transceiver circuitry i.e., analog sampling of the PA output signal and digital interpolation/digital adaptive algorithm to generate the digital weight w.

FIG. 1 is an example scenario 100 that utilizes a system for self-interference cancellation in a transceiver circuitry of a portable device. The scenario 100 shows a device 102 with an antenna 104, and another device 106 with an antenna 108

The devices 102 or 106 may include, but is not limited to, a tablet computer, a netbook, a notebook computer, a laptop computer, mobile phone, a cellular phone, a smartphone, a personal digital assistant, a multimedia playback device, a digital music player, a digital video player, a navigational device, a digital camera, and the like.

The device 102, for example, may communicate with the other device 106 in a network environment. The network environment, for example, includes a cellular base station configured to facilitate communications between the device 102 and the other device 106. In another example, the device 102 communicates with an access point (AP) (not shown) using wireless fidelity (Wi-Fi) orthogonal frequency division multiplexing (OFDM) data packets. In both of these examples, echo cancellation technique as described in present implementations herein may be applied during transmission operations of the transmitting device 102 or 106.

For example, prior to the OFDM data packet transmission by the device 102, an initial echo cancellation may be performed at the transceiver circuitry (not shown) in order to minimize and/or cancel signal leakages. In this example, the echo cancellation may utilize a substantially reduced number of components (i.e., about two down-converter components) to generate an echo-free signal. Furthermore, the echo cancellation combines the use of an analog and digital portions of the transceiver circuitry to implement the substantially reduce number of components.

Figure 2:
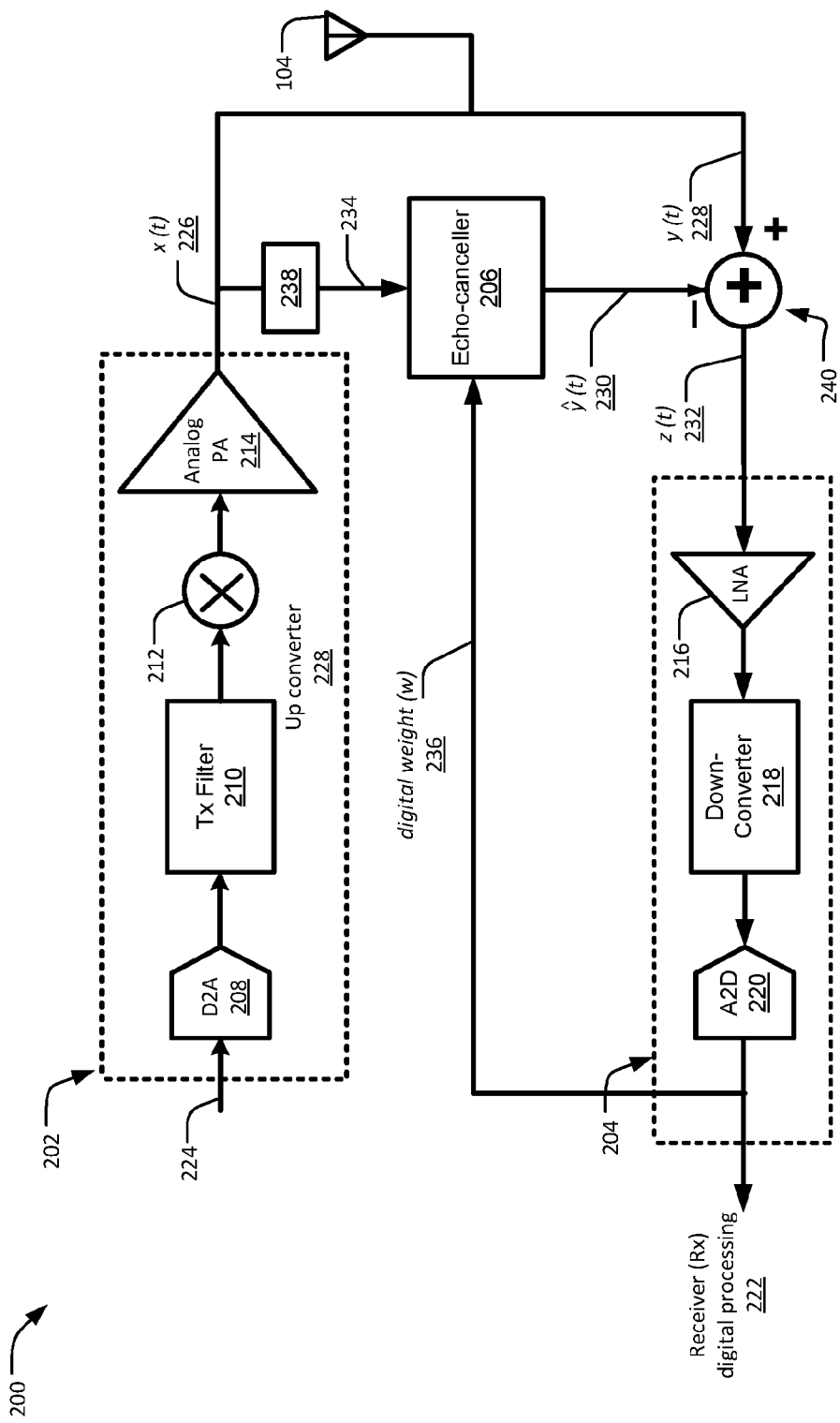
FIG. 2 illustrates an example apparatus that is configured to implement an echo cancellation in a transceiver circuitry of a device.

The example arrangement 100 illustrates in a limited manner basic components of wireless communications between the devices 102 and 106, other components such as battery, one or more processors, SIM card, etc. were not described in order to simplify the embodiments described herein FIG. 2 illustrates an example component or apparatus 200 that is configured to implement the echo cancellation in the transceiver circuitry of the portable device 102. Particularly, the apparatus 200 may perform echo estimation and cancellation in between a transmit chain and a receiver chain of the transceiver circuitry of the portable device.

As shown, the apparatus 200 includes a transmit chain 202, a receive chain 204, an echo canceller 206, and the antenna 104. The transmit chain 202 may further include, but is not limited to, a digital to analog converter (D2A) 208, a transmit (Tx) filter 210, a mixer 212, and an analog PA 214. The receive chain 204 may further include, but is not limited to, a low noise amplifier (LNA) 216, a down-converter 218 (i.e., receiver baseband filter), and an analog to digital converter (A2D) 220 that supplies analog baseband signals to receiver digital processing 222.

The apparatus 200 further shows an input signal 224 that may represent an original signal to be transmitted (e.g., OFDM data packet prior to having analog distortion); an output signal x(t) 226 that represents an output of the transmit chain 202 or the analog PA 214; an echo signal y(t) 228 that represents an actual echo signal or signal leaking to the receive chain 204; and an estimated echo signal ŷ(t) 230 that is subtracted from the echo signal y(t) 228 to generate an echo-free signal z(t) 232.

Furthermore still, the estimated echo signal ŷ(t) 230 may be derived using a sampled analog signal 234 and a digital weight (w) signal 236. The tapped or sampled analog signal 234 may be derived through a directional coupler 238 that samples the output signal x(t) 226. In certain implementations, the digital weight (w) signal 236 may be supplied by a processor (not shown) that performs an adaptive algorithm such as least mean square (LMN), RLS, etc. to generate the digital weight (w) signal 236.

As a general overview of apparatus 200 operation, the input signal 224 (prior to signal transmission) may leak from the transmit chain 202 to the received chain 204. In such instances, the echo canceller 206 may be configured to generate the estimated echo signal ŷ(t) 230, which is subtracted from the signal leakages (i.e., echo signal y(t) 228) in order to generate/produce the echo-free signal z(t) 232. A subtractor 240 may be configured to subtract the estimated echo signal ŷ(t) 230 from the echo signal y(t) 228) to generate the echo-free signal z(t) 232.

As described herein, the estimated echo signal ŷ(t) 230 is generated using a substantial minimum number of components such as, for example, using a single down-converter component (not shown) at the echo canceller 206 in addition to the down-converter 218 as shown in the receive chain 204. In this example, a digital interpolation is performed in lieu of multiple down-converters that may be required during complex multiplication process to generate the estimated echo signal ŷ(t) 230.

The echo canceller 206 may include a finite infinite response (FIR) filter (not shown) configured to split or sub-divide the output signal x (t) 226 and particularly, the sampled analog signal 234 with corresponding different delays. The number of the different delays may be based upon the delay spread over a channel and bandwidth of the sampled analog signal 234. The echo canceller 206 may further include a vector modulator (not shown) that performs the complex multiplication process between a particular calculated digital weight (w) signal 236 and the corresponding delay from the FIR filter. Multiple outputs from different vector modulators are then combined to form the estimated echo signal ŷ(t) 230 as further discussed below.

During transmission operations on the transmit chain 202, the input signal 224 may be transmitted through the antenna 104 and arrives from the transmit chain 202 to the receive chain 204. For example, the transmit chain 202 converts the input signal 224 into digital signal through the D2A 208; filters the digital input signal through the Tx Filter 210; and up-converts frequency of the digital input signal (through the mixer 212) prior to amplification by the analog PA 214. The analog PA 214 may generate a modulated radio frequency (RF) signal carrying the input signal 224 for transmission by the antenna 104.

As described herein, the transmitted RF signal may include the OFDM data packets or a combination of in-phase (I) and quadrature-phase (Q) modulated data packets. Rather than using multiple number of down-converters for the I and Q signals, the embodiment described herein may utilize about two down-converters to implement the echo cancellation. For example, the use of digital interpolation on down-converted different delays from the FIR filter may substitute for the multiple number of down-converters for each I and Q signals to be transmitted. In this example, power savings and complexity reduction may be derived when the apparatus 200 compensates for the signal leakages.

Figure 3:
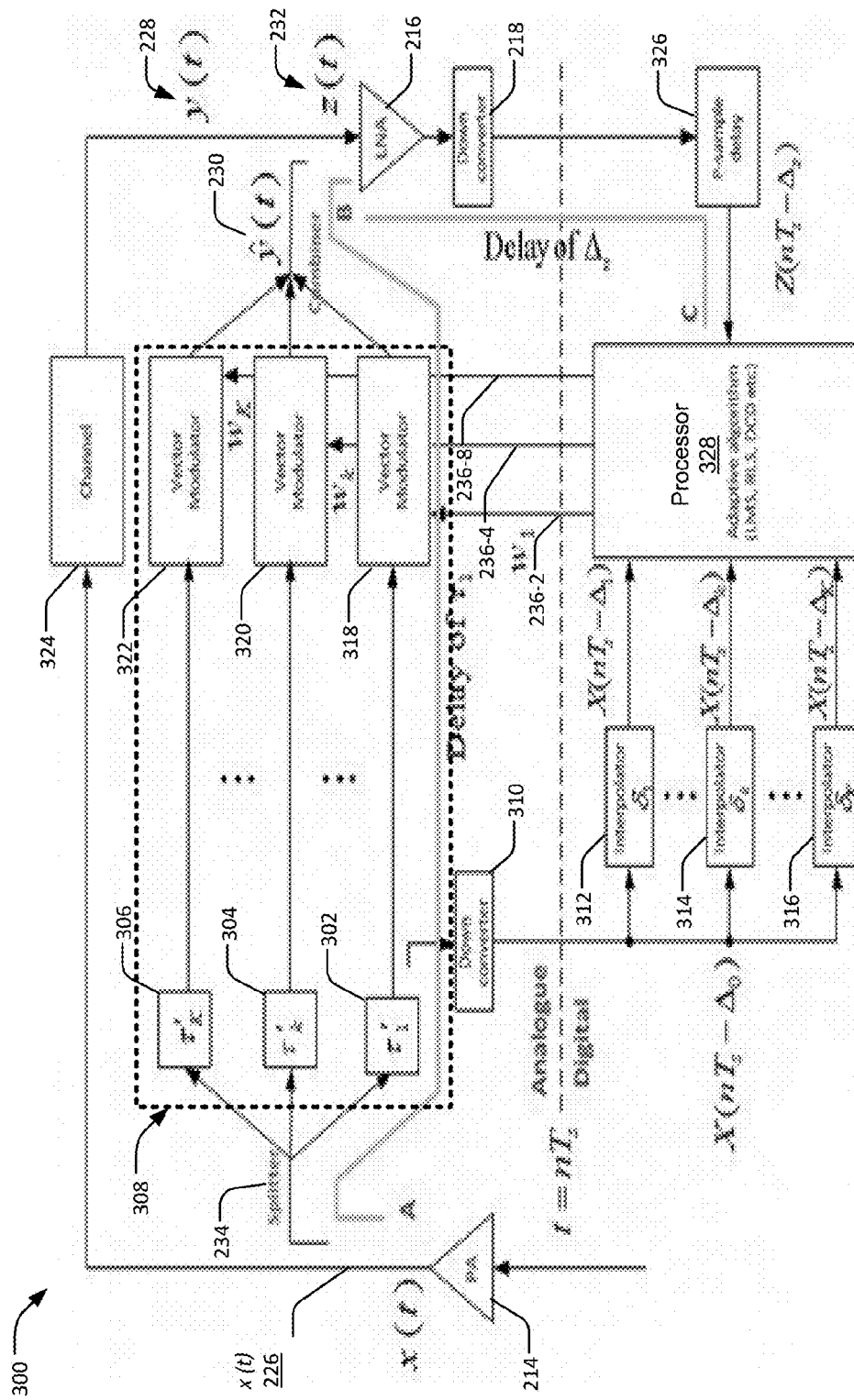
FIG. 3 illustrates an example architecture that implements an echo cancellation as described in accordance with implementations herein.

FIG. 3 is a block diagram of an example architecture 300 that implements the echo cancellation as described herein. As shown, the architecture 300 illustrates the analog sampled signal 234 that is sub-divided into different delays $\tau'_1$ 302, $\tau'_k$ 304, and $\tau'_K$ 306 by a FIR filter 308. The signal after the delay $\tau'_1$ 302 (i.e., signal with shortest delay) is further down-converted at one end using a down-converter 310, and the down-converted signal with the shortest delay is further interpolated by a first interpolator 312, a second interpolator 314, and a third interpolator 316, to create signals with longer delays i.e., $X(nT_s-\Delta_1)$, $X(nT_s-\Delta_k)$, and $X(nT_s-\Delta_K)$.

At another end, the different delays $\tau'_1$ 302, $\tau'_k$ 304, and $\tau'_K$ 306 from the FIR filter 308 are further supplied to vector modulators 318, 320, and 322, respectively. Furthermore, the vector modulators 318, 320, and 322 may additionally receive digital weight (w) signals 236-2, 236-4, and 236-6, respectively.

With the received digital weight (w) signals 236, the vector modulators 318, 320, and 322 may respectively perform complex multiplications on the delays $\tau'_1$ 302, $\tau'_k$ 304, and $\tau'_K$ 306 and the corresponding digital weight (w) signals 236-2, 236-4, and 236-6. That is, the vector modulator 318, for example, is configured to perform a complex multiplication between the delay $\tau'_1$ 302 and the digital weight (w) signal 236-2; the vector modulator 320 is configured to perform complex multiplication between the delay $\tau'_k$ 304 and the digital weight (w) signal 236-2; and so on.

After the complex multiplications by the vector modulators 318, 320, and 322, each output of the vector modulators 318, 320, and 322 are combined to generate the total estimated echo signal ŷ(t) 230 i.e., echo canceller signal.

With continuing reference to FIG. 3, the architecture 300 further shows a channel 324 that may include a channel response from an output of the PA 214 to an input of the receive chain 204 (or input of the LNA 216); and a P-sample delay 326 that represents a delay between an output of the A2D (not shown) and an input of a processor 328 i.e., adaptive algorithm. As described herein, the purpose of the architecture 300 is to reduce the feedback delay ($\Delta_z$) for stable operation of the processor 328 in performing the adaptive algorithm, and furthermore, for faster convergence in the generation of the digital weight (w) signal 236. To this end, the efficiency of the echo cancellation using minimal number of hardware components is increased.

With reference to the echo signal y (t) 228 of FIGS. 2-3, the received echo signals in passband or through the channel 324 may be written as:

$$y(t) = \sum_n h_n x(t - \bar{\tau}_n)$$

where variable x(t) is the output signal x(t) 226; and the variable $h_n$ represents gain of $n^{th}$ echo with a delay $\bar{\tau}_n$ To determine the estimated echo signal ŷ(t) 230 with the use of K-tap delay lines, we have:

$$\hat{y}(t) = \sum_{k=1}^{K} w_k x(t - \tau_k)$$

where $w_k$ is a complex weight or the digital weight (w) signal 236; and the delay at $k^{th}$ branch delay $\tau_k$ is $\tau_k < \tau_{k+1}$. The $k^{th}$ branch delay $\tau_k$ as defined herein includes the delay from the output of the analog PA 214 to the input of the LNA 216.

With the received echo signal y (t) 228 and the estimated echo signal ŷ(t) 230, the echo-free signal z (t) 232 may be defined by the equation below:

$$z(t) = y(t) - \hat{y}(t) = y(t) - \sum_{k=1}^{K} w_k x(t - \tau_k).$$

In an implementation, the echo-free signal z (t) 232 may be derived with the use of about two down-converters. That is, the down-converters 310 and 218 are utilized for $x(t-\tau'_1)$ and z(t), respectively, where $\tau'_k < \tau'_{k+1}$ is assumed.

After converting analog output signal of the down-converter 310 into digital signals (using a sampling period $T_s$), an interpolator input may be denoted as $X(nT_s-\Delta_0)$ where the delay $\Delta_0$ is the delay from the output of the PA 214 to the input side of the interpolator (e.g., interpolator 312).

As described herein, the $k^{th}$ interpolator 314 generates a signal with a longer delay—$X(nT_s-\Delta_k)$ using the input signal $X(nT_s-\Delta_0)$. The delay $\Delta_k$ (for the generated signal $X(nT_s-\Delta_k)$) is the delay from the output of the analog PA 214 to the output of the interpolator 314. To this end, the delay $\Delta_k$ includes the delay of the interpolator itself.

With reference to other delay at the down-converter 218 side, the delay from the input side of the LNA 216 to the input side (denoted by "C" in FIG. 3) of the processor 328 may be represented as delay $\Delta_z$. As such, the input to the processor 328 may be represented as $Z(nT_s-\Delta_z)$. The P-sample delay 326 and the interpolator delay may be further adjusted to have $\Delta_k=\tau_k+\Delta_z$ since the interpolator delay itself creates a delay.

Hence, the $k^{th}$ interpolator 314 may generate the delay:

$$\Delta_{interpolator,k} \equiv \Delta_k - \Delta_0 = \tau_k + \Delta_z - \Delta_0.$$

By splitting further the delay into integer multiple of the sampling period $T_s$ and fraction of the sampling period $T_s$, the $k^{th}$ interpolator 314 may generate:

$$\Delta_{interpolator,k} \equiv NT_s + \delta_k \text{ where } 0 \leq \delta_k < T_s.$$

Thus, the interpolator itself may have "N" sample delays and a 2N-tap FIR interpolator may be utilized to generate the "N" sample delays. Furthermore, fractional interpolation function may facilitate creation of fractional delay of $\delta_k$. Hence, using past N and future N samples of $X(nT_s-\Delta_0)$, $X(nT_s-\Delta_0-1)$, ..., $X(nT_s-\Delta_0-2N+1)$, the function $X(nT_s-\Delta_k)$ is generated.

In an implementation, the number of FIR filter taps for Z(n) may be adjusted by dynamically adjusting the P-sample delay 326. For example, when using least mean square (LMS) in calculating the digital weight (w) signal 236 corresponding to the $k^{th}$ interpolator 314, we have $$w_k = w_k + \mu X^*(nT_s-\Delta_k)Z(nT_s-\Delta_k) = w_k + \mu X^*(nT_s-\Delta_z-\tau_k)Z(nT_s-\Delta_z).$$

The variable "$w_k$" is the calculated digital weight (w) signal 236; p is a step-size; and superscript "*" is a complex conjugate.

As described herein, there is a delay difference of $\tau_k$ with the feedback delay of $\Delta_z$ due to the following condition i.e., $\Delta_k=\tau_k+\Delta_z$; $X(nT_s-\Delta_z-\tau_k)$ and $Z(nT_s-\Delta_z)$.

In summary, the digital interpolations and the digital adaptive algorithm that may be implemented in the processor 328, in combination with the analog different delays from the FIR filter 308, may facilitate the reduction of number of down-converters during the echo cancellation process in the portable device 102.

Figure 4:
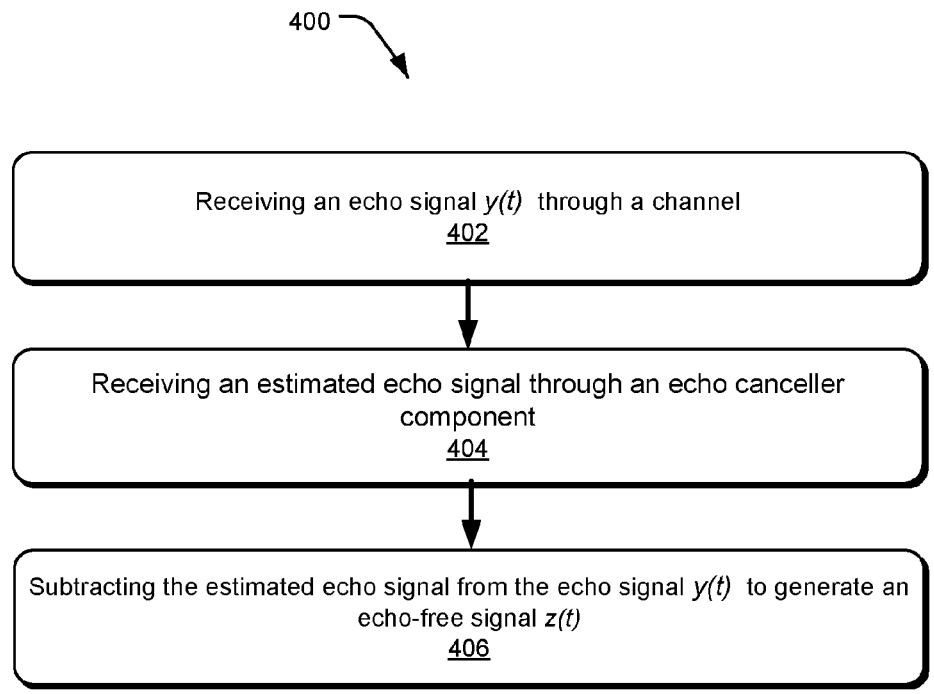
FIG. 4 illustrates an exemplary process for implementing an example method for echo cancellation in a transceiver circuitry of a device.

FIG. 4 shows an example process flowchart 400 illustrating an example method for echo cancellation in a transceiver circuitry of a device. For example, the echo cancellation includes cancelling signal leakages prior to data packet transmission. The order in which the method is described is not intended to be construed as a limitation, and any number of the described method blocks may be combined in any order to implement the method, or alternate method. Additionally, individual blocks may be deleted from the method without departing from the spirit and scope of the subject matter described herein. Furthermore, the method may be implemented in any suitable hardware, software, firmware, or a combination thereof, without departing from the scope of the invention.

At block 402, receiving an echo signal through a channel is performed. For example, the receiver chain 204 and particularly the LNA 216 receives the echo signal y (t) 228 through the channel 324. In this example, the echo signal y (t) 228 may include the actual amount of signal leakages from the transmit chain 202 to the receiver chain 204.

At block 404, receiving an estimated echo signal through an echo canceller is performed. For example, the estimated echo signal y(t) 230 is received through the echo canceller 206. In this example, the estimated echo signal ŷ(t) 230 is derived using a substantially minimized number of components such as a single down-converter 310 in addition to the down-converter 218 of the receiver chain 204.

At block 406, subtracting the estimated echo signal from the received echo signal to generate an echo-free signal is performed. For example, the estimated echo signal ŷ(t) 230 is combined with the echo signal y (t) 228 by the subtractor 240 in order to generate the echo-free signal z (t) 232.

Figure 5:
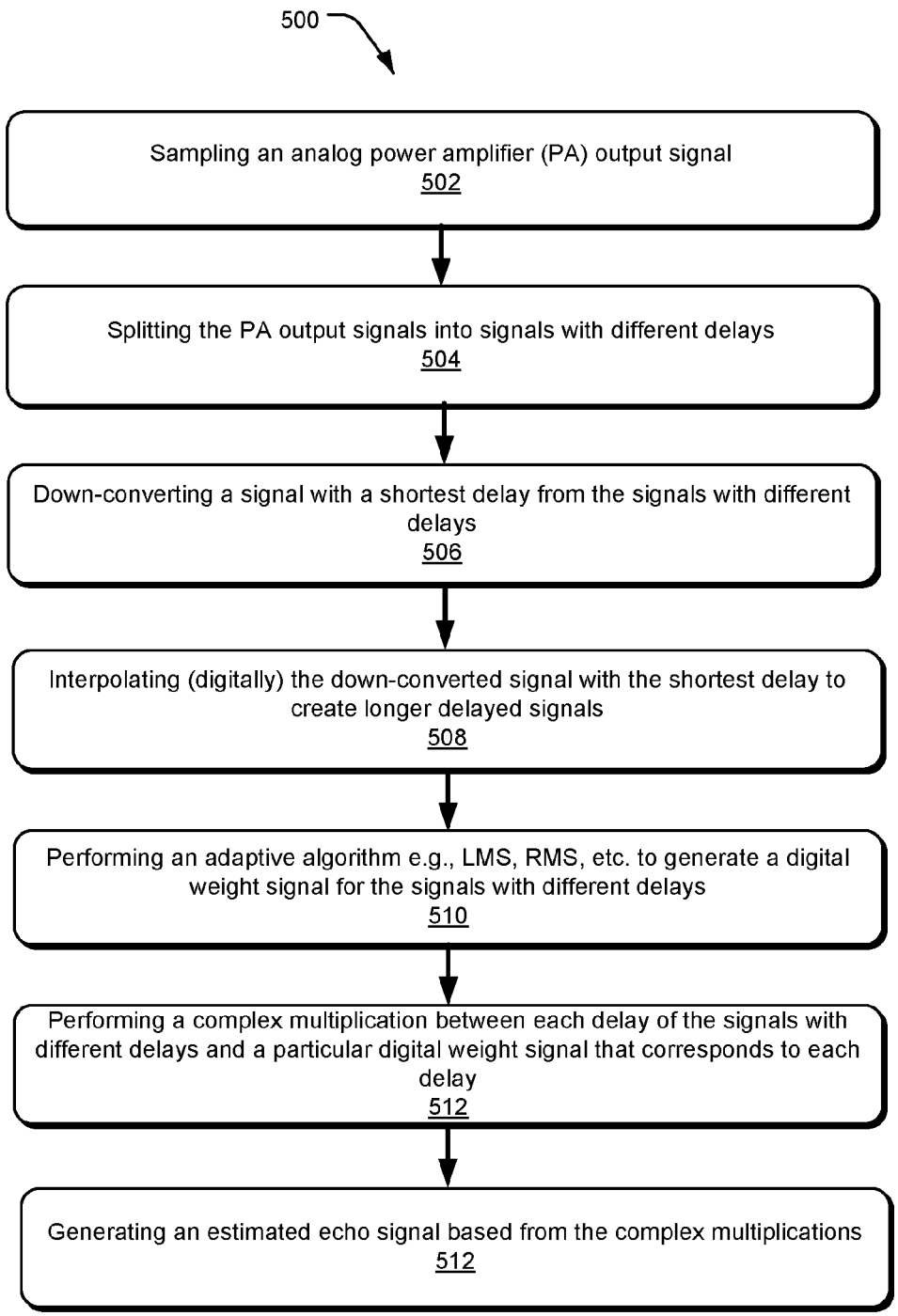
FIG. 5 illustrates an exemplary process for deriving an estimated echo signal $\hat{y}(t)$ as described herein.

FIG. 5 shows an example process flowchart 500 illustrating an example method for deriving the estimated echo signal ŷ(t) 230 as described herein. For example, the derivation of the estimated echo signal ŷ(t) 230 utilizes a combination of the analog FIR filter and digital interpolation and adaptive algorithm to generate the digital weight (w) signal 236. The order in which the method is described is not intended to be construed as a limitation, and any number of the described method blocks may be combined in any order to implement the method, or alternate method. Additionally, individual blocks may be deleted from the method without departing from the spirit and scope of the subject matter described herein. Furthermore, the method may be implemented in any suitable hardware, software, firmware, or a combination thereof, without departing from the scope of the invention.

At block 502, sampling an analog PA output signal is performed. For example, the directional coupler 238 is configured to sample the PA output signal x (t) 226 to generate the sampled signal 234.

At block 504, splitting the sampled analog PA output signal into signals with different delays is performed. For example, the FIR filter 308 is configured to generate the different delays $\tau'_1$ 302, $\tau'_k$ 304, and $\tau'_K$ 306. In this example, the different delays $\tau'_1$ 302, $\tau'_k$ 304, and $\tau'_K$ 306 correspond to different echo delays of the signal leakage from the transmit chain 202 to the receiver chain 204. Furthermore, each delay on the different delays is based upon a bandwidth (BW) of the PA output signal x (t) 226.

At block 506, down-converting a shortest delay from the different delays using a single down-converter is performed. For example, rather than using multiple down-converters for the signals with different delays $\tau'_1$ 302, $\tau'_k$ 304, and $\tau'_K$ 306, a single down-converter 310 may be utilized to down-convert the signal shortest delay $\tau'_1$ 302.

At block 508, interpolating a signal with the shortest delay to create longer delayed signals is performed. For example, the first interpolator 312, second interpolator 314, and the third interpolator 316 are configured to interpolate the shortest delay $\tau'_1$ 302 to create longer delayed signals i.e., $X(nT_s-\Delta_1)$, $X(nT_s-\Delta_k)$, and $X(nT_s-\Delta_K)$. In this example, the output of the down-converter 310 is converted into digital signals prior to the interpolation.

At block 510, performing an adaptive algorithm on the interpolated signal to generate a digital weight signal is performed. For example, the processor 328 is configured to perform the adaptive algorithm such as least mean square (LMN), RLS, etc. to generate the digital weight (w) signal 236. In this example, the digital weight (w) signal 236 is based upon an output of the digital interpolation of the signal with the shortest delay i.e., and a down-converted signal from the receiver chain the output of the interpolator i.e., $X(nT_s-\Delta_1)$, $X(nT_s-\Delta_k)$, and $X(nT_s-\Delta_K)$, and a down-converted signal from the receiver chain 204.

At block 512, performing a complex multiplication between each delay of the different delays and the digital weight signal that corresponds to each delay is performed. For example, the vector modulator 318 is configured to perform the complex multiplication between the delay $\tau'_1$ 302 and the digital weight (w) signal 236-2; the vector modulator 320 is configured to perform complex multiplication between the delay $\tau'_k$ 304 and the digital weight (w) signal 236-2; and so on.

At block 514, generating the estimated echo signal is performed. For example, the outputs of the vector modulators 318-322 are combined to generate the echo canceller signal or the estimated echo signal ŷ(t) 230.

In an implementation, the LNA 216 may be disabled when the estimated echo signal ŷ(t) 230 is not sufficient initially in order to avoid saturation in LNA. Once residual echo power is small enough not to saturate the LNA 216, then the LNA 216 may be enabled.

Figure 6:
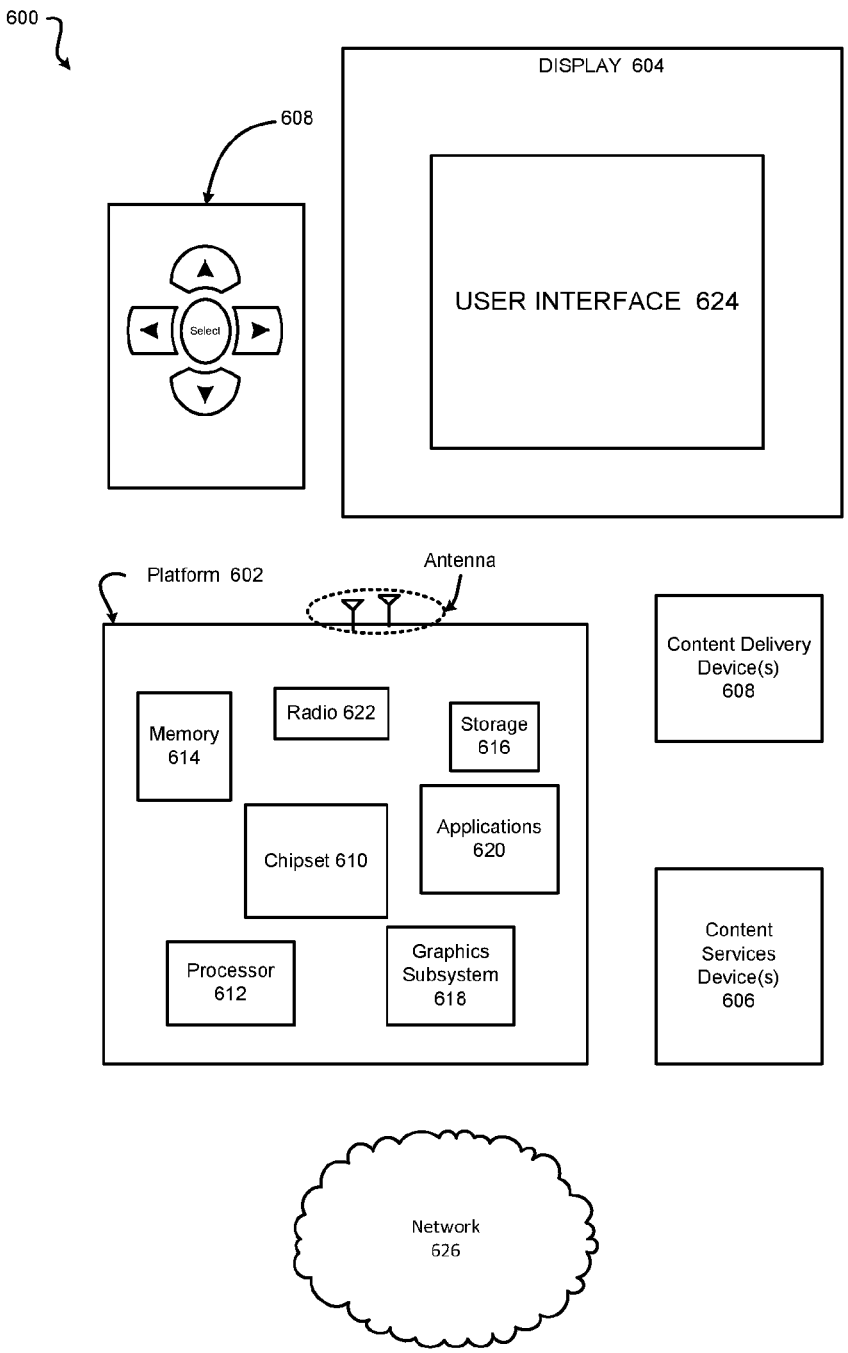
FIG. 6 illustrates an example system of a device that utilizes the echo cancellation in accordance with implementations herein.

FIG. 6 illustrates an example system 600 of a device in accordance with the present disclosure. For example, the apparatus 200 is a circuitry block within the example system 600. In various implementations, the system 600 may be a media system although system 600 is not limited to this context. For example, system 600 may be incorporated into a personal computer (PC), laptop computer, ultra-laptop computer, tablet, touch pad, portable computer, handheld computer, palmtop computer, personal digital assistant (PDA), cellular telephone, combination cellular telephone/PDA, television, smart device (e.g., smart phone, smart tablet or smart television), mobile internet device (MID), messaging device, data communication device, and so forth.

In various implementations, system 600 includes a platform 602 coupled to a display 604. Platform 602 may receive content from a content device such as content services device(s) 606 or content delivery device(s) 608 or other similar content sources. A navigation controller 608 including one or more navigation features may be used to interact with, for example, platform 602 and/or display 604. Each of these components is described in greater detail below.

In various implementations, platform 602 may include any combination of a chipset 610, processor 612, memory 614, storage 616, graphics subsystem 618, applications 620 and/or radio 622. Chipset 610 may provide intercommunication among processor 612, memory 614, storage 616, graphics subsystem 618, applications 620 and/or radio 622. For example, chipset 610 may include a storage adapter (not depicted) capable of providing intercommunication with storage 616.

Processor 612 may be implemented as a Complex Instruction Set Computer (CISC) or Reduced Instruction Set Computer (RISC) processors, x86 instruction set compatible processors, multi-core, or any other microprocessor or central processing unit (CPU). In various implementations, processor 510 may be dual-core processor(s), dual-core mobile processor(s), and so forth.

Memory 614 may be implemented as a non-volatile memory device such as, the PCM memory cell. In an implementation, the memory 614 is coupled to the processor 612 and a transceiver circuit (e.g., radio 622), which utilizes the apparatus 200 in its circuitry block.

Storage 616 may be implemented as another non-volatile storage device such as, but not limited to, a magnetic disk drive, optical disk drive, tape drive, an internal storage device, an attached storage device, flash memory, battery backed-up SDRAM (synchronous DRAM), and/or a network accessible storage device. In various implementations, storage 616 may include technology to increase the storage performance enhanced protection for valuable digital media when multiple hard drives are included, for example.

Graphics subsystem 618 may perform processing of images such as still or video for display. Graphics subsystem 618 may be a graphics processing unit (GPU) or a visual processing unit (VPU), for example. An analog or digital interface may be used to communicatively couple graphics subsystem 618 and display 604. For example, the interface may be any of a High-Definition Multimedia Interface, Display Port, wireless HDMI, and/or wireless HD compliant techniques. Graphics subsystem 618 may be integrated into processor 612 or chipset 610. In some implementations, graphics subsystem 618 may be a stand-alone card communicatively coupled to chipset 610.

The graphics and/or video processing techniques described herein may be implemented in various hardware architectures. For example, graphics and/or video functionality may be integrated within a chipset. Alternatively, a discrete graphics and/or video processor may be used. As still another implementation, the graphics and/or video functions may be provided by a general-purpose processor, including a multi-core processor. In further embodiments, the functions may be implemented in a consumer electronics device.

Radio 622 may include one or more radios capable of transmitting and receiving signals using various suitable wireless communications techniques. Such techniques may involve communications across one or more wireless networks. Example wireless networks include (but are not limited to) wireless local area networks (WLANs), wireless personal area networks (WPANs), wireless metropolitan area network (WMANs), cellular networks, and satellite networks. In communicating across such networks, radio 518 may operate in accordance with one or more applicable standards in any version. Furthermore, the radio 622 is a part of a transceiver block in the system 600 that may utilize the apparatus 200 in its circuitry block.

In various implementations, display 604 may include any television type monitor or display. Display 604 may include, for example, a computer display screen, touch screen display, video monitor, television-like device, and/or a television. Display 604 may be digital and/or analog. In various implementations, display 604 may be a holographic display. In addition, display 604 may be a transparent surface that may receive a visual projection. Such projections may convey various forms of information, images, and/or objects. For example, such projections may be a visual overlay for a mobile augmented reality (MAR) application. Under the control of one or more software applications 620, platform 602 may display user interface 624 on display 604.

In various implementations, content services device(s) 606 may be hosted by any national, international and/or independent service and thus accessible to platform 602 via the Internet, for example. Content services device(s) 606 may be coupled to platform 602 and/or to display 604. Platform 602 and/or content services device(s) 606 may be coupled to a network 626 to communicate (e.g., send and/or receive) media information to and from network 626. Content delivery device(s) 608 also may be coupled to platform 602 and/or to display 604.

In various implementations, content services device(s) 606 may include a cable television box, personal computer, network, telephone, Internet enabled devices or appliance capable of delivering digital information and/or content, and any other similar device capable of unidirectionally or bidirectionally communicating content between content providers and platform 602 and/display 604, via network 626 or directly. It will be appreciated that the content may be communicated unidirectionally and/or bidirectionally to and from any one of the components in system 600 and a content provider via network 626. Examples of content may include any media information including, for example, video, music, medical and gaming information, and so forth.

Content services device(s) 606 may receive content such as cable television programming including media information, digital information, and/or other content. Examples of content providers may include any cable or satellite television or radio or Internet content providers. The provided examples are not meant to limit implementations in accordance with the present disclosure in any way.

In various implementations, platform 602 may receive control signals from navigation controller 608 having one or more navigation features. The navigation features of controller 608 may be used to interact with user interface 624, for example. In embodiments, navigation controller 608 may be a pointing device that may be a computer hardware component (specifically, a human interface device) that allows a user to input spatial (e.g., continuous and multi-dimensional) data into a computer. Many systems such as graphical user interfaces (GUI), and televisions and monitors allow the user to control and provide data to the computer or television using physical gestures.

Movements of the navigation features of controller 608 may be replicated on a display (e.g., display 604) by movements of a pointer, cursor, focus ring, or other visual indicators displayed on the display. For example, under the control of software applications 620, the navigation features located on navigation controller 608 may be mapped to virtual navigation features displayed on user interface 624, for example. In embodiments, controller 608 may not be a separate component but may be integrated into platform 602 and/or display 604. The present disclosure, however, is not limited to the elements or in the context shown or described herein.

In various implementations, drivers (not shown) may include technology to enable users to instantly turn on and off platform 602 like a television with the touch of a button after initial boot-up, when enabled, for example. Program logic may allow platform 602 to stream content to media adaptors or other content services device(s) 606 or content delivery device(s) 608 even when the platform is turned "off." In addition, chipset 610 may include hardware and/or software support for 5.1 surround sound audio and/or high definition 7.1 surround sound audio, for example. Drivers may include a graphics driver for integrated graphics platforms. In embodiments, the graphics driver may comprise a peripheral component interconnect (PCI) Express graphics card.

In various implementations, any one or more of the components shown in system 600 may be integrated. For example, platform 602 and content services device(s) 606 may be integrated, or platform 602 and content delivery device(s) 608 may be integrated, or platform 602, content services device(s) 606, and content delivery device(s) 608 may be integrated, for example. In various embodiments, platform 602 and display 604 may be an integrated unit Display 604 and content service device(s) 606 may be integrated, or display 604 and content delivery device(s) 608 may be integrated, for example. These examples are not meant to limit the present disclosure.

In various embodiments, system 600 may be implemented as a wireless system, a wired system, or a combination of both. When implemented as a wireless system, system 600 may include components and interfaces suitable for communicating over a wireless shared media, such as one or more antennas, transmitters, receivers, transceivers, amplifiers, filters, control logic, and so forth. An example of wireless shared media may include portions of a wireless spectrum, such as the RF spectrum and so forth. When implemented as a wired system, system 600 may include components and interfaces suitable for communicating over wired communications media, such as input/output (I/O) adapters, physical connectors to connect the I/O adapter with a corresponding wired communications medium, a network interface card (NIC), disc controller, video controller, audio controller, and the like. Examples of wired communications media may include a wire, cable, metal leads, printed circuit board (PCB), backplane, switch fabric, semiconductor material, twisted-pair wire, co-axial cable, fiber optics, and so forth.

Platform 602 may establish one or more logical or physical channels to communicate information. The information may include media information and control information. Media information may refer to any data representing content meant for a user. Examples of content may include, for example, data from a voice conversation, videoconference, streaming video, electronic mail ("email") message, voice mail message, alphanumeric symbols, graphics, image, video, text and so forth. Data from a voice conversation may be, for example, speech information, silence periods, background noise, comfort noise, tones and so forth. Control information may refer to any data representing commands, instructions or control words meant for an automated system. For example, control information may be used to route media information through a system, or instruct a node to process the media information in a predetermined manner. The embodiments, however, are not limited to the elements or in the context shown or described in FIG. 6.

Figure 7:
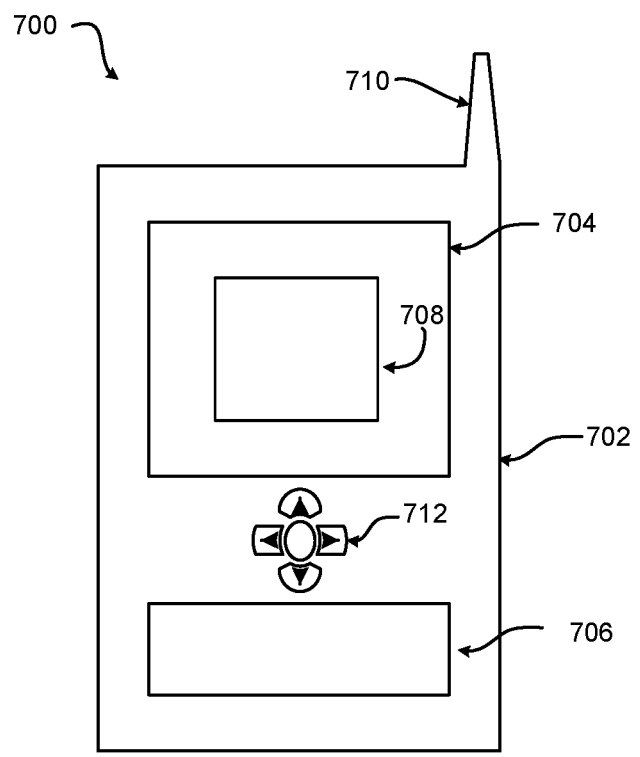
FIG. 7 illustrates an example device that utilizes the echo cancellation described in accordance with implementations herein.

As described above, system 600 may be embodied in varying physical styles or form factors. FIG. 7 illustrates implementations of a small form factor device 700 in which system 600 may be embodied. In embodiments, for example, device 700 may be implemented as a mobile computing device having wireless capabilities. A mobile computing device may refer to any device having a processing system and a mobile power source or supply, such as one or more batteries, for example.

As described above, examples of a mobile computing device may include a personal computer (PC), laptop computer, ultra-laptop computer, tablet, touch pad, portable computer, handheld computer, palmtop computer, personal digital assistant (PDA), cellular telephone, combination cellular telephone/PDA, television, smart device (e.g., smart phone, smart tablet or smart television), mobile internet device (MID), messaging device, data communication device, and so forth.

Examples of a mobile computing device also may include computers that are arranged to be worn by a person, such as a wrist computer, finger computer, ring computer, eyeglass computer, belt-clip computer, arm-band computer, shoe computers, clothing computers, and other wearable computers. In various embodiments, for example, a mobile computing device may be implemented as a smart phone capable of executing computer applications, as well as voice communications and/or data communications. Although some embodiments may be described with a mobile computing device implemented as a smart phone by way of example, it may be appreciated that other embodiments may be implemented using other wireless mobile computing devices as well. The embodiments are not limited in this context.

As shown in FIG. 7, device 700 may include a housing 702, a display screen 704, an input/output (I/O) device 706, a network interface card (NIC) 708 and a transceiver component 710. Device 700 also may include navigation features 712. The display screen 704 may include any suitable display unit for displaying information appropriate for a mobile computing device. For example, the display screen 704 displays the personalized message that the personalized communication program may generate. The I/O device 706 may include any suitable I/O device or user interface (UI) for entering information into a mobile computing device such as when a user opts-in to the personalized communication program. Examples for I/O device 706 may include an alphanumeric keyboard, a numeric keypad, a touch pad, input keys, buttons, switches, rocker switches, microphones, speakers, voice recognition device and software, and so forth. Information also may be entered into device 600 by way of microphone (not shown). Such information may be digitized by a voice recognition device (not shown). The embodiments are not limited in this context.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

Realizations in accordance with the present invention have been described in the context of particular embodiments. These embodiments are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the various configurations may be implemented as a combined structure or component. These and other variations, modifications, additions, and improvements may fall within the scope of the invention as defined in the claims that follow.

The following examples pertain to further embodiments:

Example 1, is a method of echo cancellation in a device, the method comprising: determining an estimated echo signal, wherein the determining comprises: sampling a power amplifier (PA) output signal; splitting the sampled PA output signal into a plurality of signals with different delays; down-convert a signal in the plurality of signals with a shortest delay by a down-converter; and performing digital interpolation on the down-converted signal with the shortest delay; and calculating an echo cancelling signal from the PA output signal to an input of a receive chain, and generating a second output signal by subtracting the calculated echo cancelling signal from a received echo signal.

In example 2, the method as recited in example 1, wherein each delay of the different delays corresponds to an echo delay of signal leakage from a transmit chain to the receive chain.

In example 3, the method as recited in example 2, wherein a number of each delay of the different delays is based upon a bandwidth (BW) of the PA output signal and delay spread of echoes of the device.

In example 4, the method as recited in example 1, wherein the digital interpolation of the down-converted signal with the shortest delay provides longer delayed signals of output signals of the PA.

In example 5, the method as recited in example 1 further comprising: converting the down-converted signal with the shortest delay into a digital signal prior to the interpolation.

In example 6, the method as recited in example 1, wherein the calculating of the echo cancelling signal further comprises: generating a digital weight (w) signal by operating on an adaptive algorithm; complex multiplying between each delay of the different delays and a particular digital weight (w) signal that corresponds to each delay; combining products of the complex multiplications for each delay to generate the estimated echo signal.

In example 7, the method as recited in example 6, wherein the digital weight (w) signal is based upon an output of the digital interpolation of the signal with the shortest delay and a down-converted signal from the receive chain.

In example 8, the method as recited in example 6, wherein the adaptive algorithm utilizes a least mean square (LMS), a recursive least square (RLS), or a dichotomous coordinate descent (DCD) algorithm.

In example 9, the method as recited in example 6, wherein the complex multiplication is implemented by a vector modulator.

In example 10, the method as recited in example 1, wherein the down-converter is in addition to a second down-converter from the receive chain.

Example 11 is a device comprising: a power amplifier (PA); an echo canceller coupled to the PA and configured to generate an estimated echo signal, wherein the echo canceller comprises: a finite impulse response (FIR) filter configured to generate signals with different delays from a sampled PA output signal; a down-converter configured to down convert a signal with a shortest delay; and one or more interpolators configured to perform interpolation on the down-converted signal with the shortest delay; and a receive chain configured to receive the estimated echo signal, and a combiner to subtract the estimated echo signal from an actual echo signal to generate a second output signal.

In example 12 the device as recited in example 11, wherein each delay on the different delays of the FIR filter corresponds to an echo delay of signal leakage from the PA output signal to the receiver chain.

In example 13 the device as recited in example 11, wherein the down-converter is in coupled to a second down-converter from the receive chain to comprise a total of two down-converters to implement echo cancellation.

In example 14 the device as recited in example 11 further comprising a directional coupler configured to sample the PA output signal.

In example 15 the device as recited in example 11 further comprising: a processor configured to perform an adaptive algorithm to generate a digital weight (w) signal; a vector modulator configured to perform a complex multiplication between each delay of the different delays and a corresponding digital weight (w) signal; and a combiner configured to add products of the complex multiplications from the vector modulators to generate the estimated echo signal.

In example 16 the device as recited in example 15, wherein the digital weight (w) signal is based upon the an output of the digital interpolation of the signal with the shortest delay and a down-converted signal from the receiver chain.

In example 17 the device as recited in example 15, wherein the adaptive algorithm utilizes a least mean square (LMS), a recursive least square (RLS), or a dichotomous coordinate descent (DCD) algorithm.

Example 18 is a device comprising: a power amplifier (PA); a directional coupler configured to sample an output of the PA; an echo canceller coupled to the directional coupler and the PA, wherein the echo canceller is configured to generate an estimated echo signal, wherein the echo canceller further comprises: a finite impulse response (FIR) filter configured to generate signals with different delays based from the sampled PA output signal; a down-converter configured to down convert a signal with a shortest delay from the signals with different delays; interpolators configured to perform interpolation on the down-converted different delays; a processor configured to perform an adaptive algorithm to generate a digital weight (w) signal; a vector modulator configured to perform a complex multiplication between each delay of the different delays and a corresponding digital weight (w) signal; and a combiner configured to add products of the complex multiplications from the vector modulators to generate the estimated echo signal; and a receive chain configured to receive the estimated echo signal, wherein the estimated echo signal is subtracted from an actual echo signal to generate an echo-free signal.

In example 19 the device as recited in example 18, wherein each delay on the generated different delays of the FIR filter corresponds to each echo delay of signal leakage from the PA output signal to the receiver chain.

In example 20 the device as recited in example 18 further comprising a low-noise amplifier (LNA) that is disabled when the residual echo signal is substantially high to avoid saturation in the LNA.

What is claimed is:

1. A method of echo cancellation in a device, the method comprising:
   determining an estimated echo signal, wherein the determining comprises:
      sampling a power amplifier (PA) output signal;
      splitting the sampled PA output signal into a plurality of signals with different delays;
      choosing and down-converting a signal from the plurality of signals with a shortest delay by a down converter, wherein the down-converting of the plurality of signals is limited to the chosen signal with the shortest delay; and
      performing digital interpolation on the down-converted signal with the shortest delay; and
   calculating an echo cancelling signal from the PA output signal to an input of a receive chain, and
   generating a second output signal by subtracting the calculated echo cancelling signal from a received echo signal.

2. The method as recited in claim 1, wherein each delay of the different delays corresponds to an echo delay of signal leakage from a transmit chain to the receive chain.

3. The method as recited in claim 2, wherein a number of each delay of the different delays is based upon a bandwidth (BW) of the PA output signal and delay spread of echoes of the device.

4. The method as recited in claim 1, wherein the digital interpolation of the down-converted signal with the shortest delay provides longer delayed signals of output signals of the PA.

5. The method as recited in claim 1 further comprising:
   converting the down-converted signal with the shortest delay into a digital signal prior to the interpolation.

6. The method as recited in claim 1, wherein the calculating of the echo cancelling signal further comprises:
   generating a digital weight (w) signal by operating on an adaptive algorithm;
   complex multiplying between each delay of the different delays and a particular digital weight (w) signal that corresponds to each delay; and
   combining products of the complex multiplications for each delay to generate the estimated echo signal.

7. The method as recited in claim 6, wherein the digital weight (w) signal is based upon an output of the digital interpolation of the signal with the shortest delay and a down-converted signal from the receive chain.

8. The method as recited in claim 6, wherein the adaptive algorithm utilizes a least mean square (LMS), a recursive least square (RLS), or a dichotomous coordinate descent (DCD) algorithm.

9. The method as recited in claim 6, wherein the complex multiplication is implemented by a vector modulator.

10. The method as recited in claim 1, wherein the down-converter is in addition to a second down-converter from the receive chain.

11. A device comprising:
    a power amplifier (PA);
    an echo canceller coupled to the PA and configured to generate an estimated echo signal, wherein the echo canceller comprises:
       a finite impulse response (FIR) filter configured to generate signals with different delays from a sampled PA output signal;
       a down-converter configured to down convert a signal with a shortest delay, the down-converting of the generated signals with different delays is limited to the signal with the shortest delay;
       one or more interpolators configured to perform interpolation on the down-converted signal with the shortest delay; and
       a receive chain configured to receive the estimated echo signal; and
    a combiner to subtract the estimated echo signal from an actual echo signal to generate a second output signal.

12. The device as recited in claim 11, wherein each delay on the different delays of the FIR filter corresponds to an echo delay of signal leakage from the PA output signal to the receiver chain.

13. The device as recited in claim 11, wherein the down-converter is in coupled to a second down-converter from the receive chain to comprise a total of two down-converters to implement echo cancellation.

14. The device as recited in claim 11 further comprising a directional coupler configured to sample the PA output signal.

15. The device as recited in claim 11 further comprising:
    a processor configured to perform an adaptive algorithm to generate a digital weight (w) signal;
    a vector modulator configured to perform a complex multiplication between each delay of the different delays and a corresponding digital weight (w) signal; and
    a combiner configured to add products of the complex multiplications from the vector modulators to generate the estimated echo signal.

16. The device as recited in claim 15, wherein the digital weight (w) signal is based upon the an output of the digital interpolation of the signal with the shortest delay and a down-converted signal from the receiver chain.

17. The device as recited in claim 15, wherein the adaptive algorithm utilizes a least mean square (LMS), a recursive least square (RLS), or a dichotomous coordinate descent (DCD) algorithm.

18. A device comprising:
    a power amplifier (PA);
    a directional coupler configured to sample an output of the PA; and
    an echo canceller coupled to the directional coupler and the PA, wherein the echo canceller is configured to generate an estimated echo signal, wherein the echo canceller further comprises:
       a finite impulse response (FIR) filter configured to generate signals with different delays based on the sampled PA output signal;
       a down-converter configured to down convert a signal with a shortest delay from the generated signals with different delays, the down-converting of the generated signals with different delays is limited to the signal with the shortest delay;
       interpolators configured to perform interpolation on the down-converted different delays;
       a processor configured to perform an adaptive algorithm to generate a digital weight (w) signal;
       a vector modulator configured to perform a complex multiplication between each delay of the different delays and a corresponding digital weight (w) signal; and
       a combiner configured to add products of the complex multiplications from the vector modulators to generate the estimated echo signal; and a receive chain configured to receive the estimated echo signal, wherein the estimated echo signal is subtracted from an actual echo signal to generate an echo-free signal.

19. The device as recited in claim 18, wherein each delay on the generated different delays of the FIR filter corresponds to each echo delay of signal leakage from the PA output signal to the receiver chain.

20. The device as recited in claim 18 further comprising a low-noise amplifier (LNA) that is disabled when the residual echo signal is substantially high to avoid saturation in the LNA.

* * * * *